United States Patent
Mo et al.

(10) Patent No.: US 8,586,972 B2
(45) Date of Patent: Nov. 19, 2013

(54) ORGANIC LIGHT EMITTING DEVICE

(75) Inventors: Yao-An Mo, Tainan (TW); Chun-Liang Lin, New Taipei (TW); Chun-Shiang Yan, Penghu County (TW); Chiung-Han Wang, Kaohsiung County (TW)

(73) Assignee: Au Optronics Corporation, Hsinchu (TW)

( * ) Notice: Subject to any disclaimer, the term of this patent is extended or adjusted under 35 U.S.C. 154(b) by 314 days.

(21) Appl. No.: 13/050,964

(22) Filed: Mar. 18, 2011

(65) Prior Publication Data
US 2012/0061701 A1 Mar. 15, 2012

(30) Foreign Application Priority Data
Sep. 10, 2010 (TW) .............................. 99130691 A

(51) Int. Cl.
*H01L 51/00* (2006.01)
(52) U.S. Cl.
USPC ............ 257/40; 257/98; 257/51.021; 438/29; 438/99
(58) Field of Classification Search
USPC .................. 438/99, 29; 257/40, E51.021, 98
See application file for complete search history.

(56) References Cited

U.S. PATENT DOCUMENTS

| 7,458,704 | B2 | 12/2008 | Naoi |
| 7,511,419 | B2 * | 3/2009 | Takei et al. ................... 313/506 |
| 2004/0211971 | A1 | 10/2004 | Takei et al. |
| 2005/0007793 | A1 * | 1/2005 | Yoshida et al. ............... 362/558 |
| 2009/0015142 | A1 | 1/2009 | Potts et al. |

FOREIGN PATENT DOCUMENTS

| CN | 1545824 | 11/2004 |
| EP | 2224788 | 9/2010 |
| TW | 1266845 | 11/2006 |
| TW | 1279588 | 4/2007 |
| TW | 200933085 | 8/2009 |

OTHER PUBLICATIONS

"First Office Action of China Counterpart Application", issued on Apr. 13, 2012, p. 1-p. 8, in which the listed foreign references were cited.

\* cited by examiner

*Primary Examiner* — Julio J Maldonado
*Assistant Examiner* — Daniel Shook
(74) *Attorney, Agent, or Firm* — Jianq Chyun IP Office

(57) ABSTRACT

An organic light emitting device includes an organic light emitting panel and at least one light extraction enhanced film. The organic light emitting panel has at least one light emitting surface. The light extraction enhanced film is disposed on the light emitting surface of the organic light emitting panel, and the light extraction enhanced film has a recess array. The recess array includes a plurality of recess holes. The recess holes are recessed toward the organic light emitting panel.

14 Claims, 5 Drawing Sheets

ORGANIC LIGHT EMITTING DEVICE

CROSS-REFERENCE TO RELATED APPLICATION

This application claims the priority benefit of Taiwan application serial no. 99130691, filed Sep. 10, 2010. The entirety of the above-mentioned patent application is hereby incorporated by reference herein and made a part of this specification.

BACKGROUND OF THE INVENTION

1. Field of the Invention

The invention relates to an organic light emitting device. More particularly, the invention relates to an organic light emitting device with high light extraction efficiency.

2. Description of Related Art

The information and communication industries have become indispensable in our society thanks to the focused development of various portable communication and display products. As the flat panel display is one of the communication interfaces between human and an information device, development of the flat panel display is rather essential. The organic light emitting device has tremendous application potential to become the mainstream of the next generation flat panel display due to its advantages of self-luminescence, wide viewing angle, low power consumption, simple manufacturing process, low cost, low working temperature, high response speed, full-color display, and so forth.

Generally, the organic light emitting device is comprised of a first electrode layer located on a substrate, a second electrode layer, and an organic light emitting layer sandwiched between the two electrode layers. The substrate and the first electrode layer are often made of a light transmissive material, such that light generated by the organic light emitting layer can be emitted. However, a refractive index of the substrate is 1.4~1.6 approximately, and a refractive index of the air is 1. Therefore, light emitted from the organic light emitting layer at a wide angle cannot be well transmitted from the substrate to the air. As such, light extraction efficiency of most organic light emitting devices simply reaches 15%~20% approximately.

SUMMARY OF THE INVENTION

The invention is directed to an organic light emitting device which can improve light extraction efficiency of light beams which are generated by an organic light emitting layer in the organic light emitting device.

The invention provides an organic light emitting device that includes an organic light emitting panel and at least one light extraction enhanced film. The organic light emitting panel has at least one light emitting surface. The light extraction enhanced film is disposed on the light emitting surface of the organic light emitting panel, and the light extraction enhanced film has a recess array. The recess array includes a plurality of recess holes. The recess holes are recessed toward the organic light emitting panel.

The invention further provides an organic light emitting device that includes a substrate, a first electrode layer, an organic light emitting layer, and a second electrode layer. The first electrode layer is located on the substrate. The organic light emitting layer is located on the first electrode layer. The second electrode layer is located on the organic light emitting layer. The substrate has a recess array that includes a plurality of recess holes, and the recess holes are recessed toward the organic light emitting layer from the substrate.

The invention further provides an organic light emitting device that includes a substrate, a first electrode layer, an organic light emitting layer, a second electrode layer, and a covering plate. The first electrode layer is located on the substrate. The organic light emitting layer is located on the first electrode layer. The second electrode layer is located on the organic light emitting layer. The covering plate is located on the second electrode layer. The covering plate has a recess array that includes a plurality of recess holes, and the recess holes are recessed toward the organic light emitting layer from the covering plate.

Based on the above, the light extraction enhanced film having the recess array is disposed on the organic light emitting panel according to the invention. Alternatively, the recess array is disposed on the substrate or on the covering plate in the invention. The light extraction efficiency of the light beams which are generated by the organic light emitting layer can be enhanced by means of the recess array.

In order to make the aforementioned and other features and advantages of the invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF EMBODIMENTS

Figure 1A:
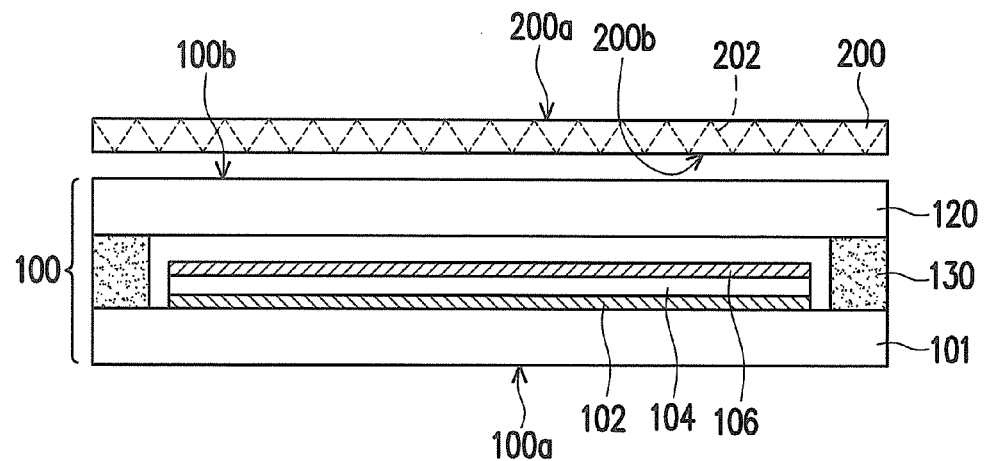
FIG. 1A is a schematic cross-sectional view illustrating an organic light emitting device according to an embodiment of the invention.

FIG. 1A is a schematic cross-sectional view illustrating an organic light emitting device according to an embodiment of the invention. With reference to FIG. 1A, the organic light emitting device of this embodiment includes an organic light emitting panel 100 and at least one light extraction enhanced film 200.

The organic light emitting panel 100 includes a substrate 101, a first electrode layer 102, an organic light emitting layer 104, and a second electrode layer 106. According to an embodiment of the invention, the organic light emitting panel 100 further includes a covering plate 120 and a sealing adhesive 130.

The substrate 101 is used to carry elements of the organic light emitting device, and the substrate 10 can be made of glass, quartz, organic polymer, a non-light-transmissive/reflective material (e.g., a conductive material, metal, wafer, ceramics, or any other suitable material), or any other suitable material.

The first electrode layer 102 is disposed on the substrate 101. Here, the first electrode layer 102 can be a patterned electrode layer or can have active devices. A material of the first electrode layer 102 can be a transparent conductive material or a non-transparent conductive material. The transparent conductive electrode includes metal oxide, such as indium tin oxide (ITO), indium zinc oxide (IZO), aluminum tin oxide (ATO), aluminum zinc oxide (AZO), indium germanium zinc oxide, other suitable oxide, or a stacked layer having at least two of the above materials. The non-transparent conductive material includes metal.

The organic light emitting layer 104 is disposed on the first electrode layer 102. In this embodiment, the organic light emitting layer 104 can include a red organic light emitting pattern, green organic light emitting pattern, a blue organic light emitting pattern, any other light emitting pattern with other colors, or a combination thereof. Besides, the organic light emitting layer 104 of other embodiments can further include an electron transmission layer, an electron injection layer, a hole transmission layer, and a hole injection layer (not shown).

The second electrode layer 106 is disposed on the organic light emitting layer 104. Here, the second electrode layer 106 can be patterned or not patterned. Generally, given the first electrode layer 102 and the second electrode layer 106 are both patterned, the organic light emitting panel 100 is a passive organic light emitting panel 100. Given the first electrode layer 102 has active devices, and the second electrode layer 106 is not patterned, the organic light emitting panel 100 is an active organic light emitting panel 100.

The covering plate 120 is disposed on the substrate 101. The sealing adhesive 130 is adhered between the covering plate 120 and the substrate 101, such that the first electrode layer 102, the organic light emitting layer 104, and the second electrode layer 106 are sealed up between the covering plate 120 and the substrate 101.

It should be mentioned that the organic light emitting panel 100 of this embodiment is a top-emissive organic light emitting panel, and the second electrode layer 106 and the covering plate 120 are made of light transmissive materials, such that the light generated by the organic light emitting layer 106 can be emitted. Namely, the organic light emitting plate 100 has a lower surface 100a and an upper surface 100b, and the upper surface 100b of the organic light emitting panel 100 is a light emitting surface.

A light extraction enhanced film 200 is disposed on the light emitting surface 100b of the organic light emitting panel 100. Specifically, the light extraction enhanced film 200 has a recess array that includes a plurality of recess holes 202, and the recess holes 202 are recessed toward the organic light emitting panel 100. The light extraction enhanced film 200 has a first surface 200a and a second surface 200b opposite to the first surface 200a. The recess array (the recess holes 202) is located on the first surface 200a, and the second surface 200b is a plane. Since the light extraction enhanced film 200 can be directly adhered to the surface (the light emitting surface 100b) of the organic light emitting panel 100, the planar second surface 200b of the light extraction enhanced film 200 is conducive to adhesion between the light extraction enhanced film 200 and the organic light emitting panel 100.

Figure 2A:
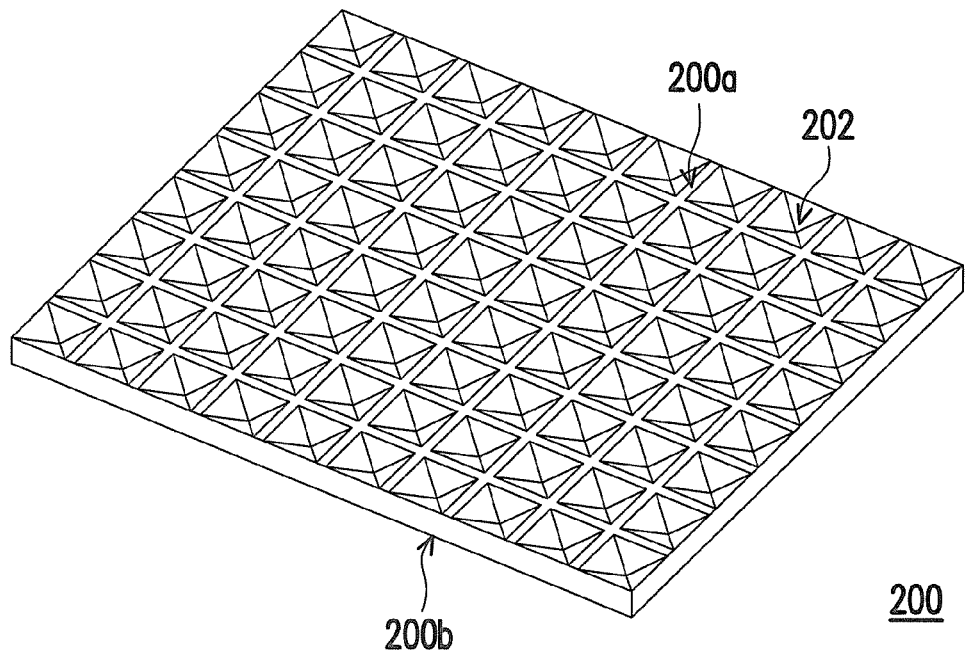
FIG. 2A is a schematic three-dimensional view illustrating a light extraction enhanced film depicted in FIG. 1A.
Figure 2B:
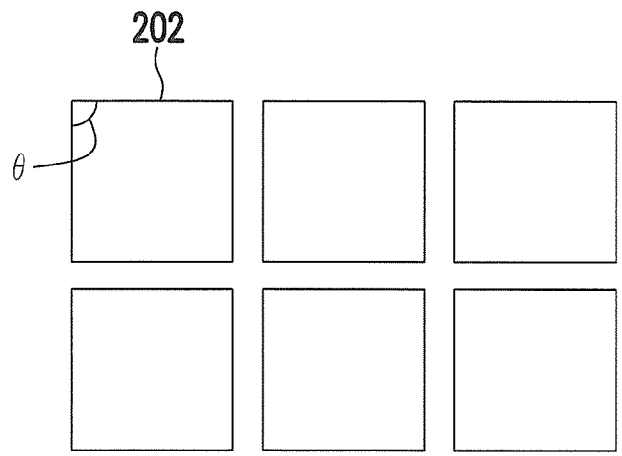
FIG. 2B is a schematic top view illustrating a recess array in the light extraction enhanced film depicted in FIG. 1A.
Figure 3A:
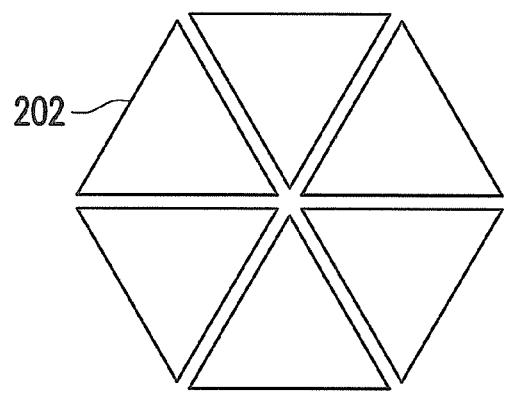
FIG. 3A to FIG. 3C are schematic top views illustrating a recess array according to other embodiments of the invention.
Figure 3B:
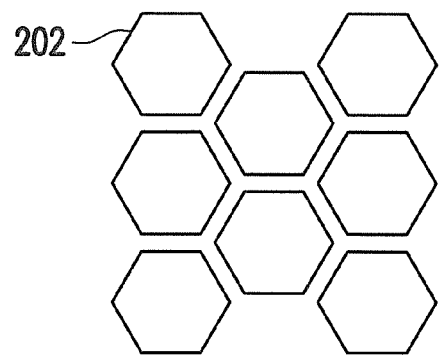
Figure 3C:
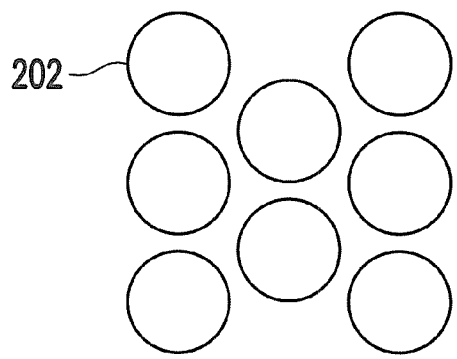

FIG. 2A is a schematic three-dimensional view illustrating a light extraction enhanced film depicted in FIG. 1A. FIG. 2B is a schematic top view illustrating a recess array in the light extraction enhanced film depicted in FIG. 1A. With reference to FIG. 2A and FIG. 2B, the recess array of the light extraction enhanced film 200 is comprised of a plurality of recess holes 202 arranged in arrays. In this embodiment, the recess holes 202 are quadrangular pyramidal recess holes, and an included angle θ between two legs of each of the pyramidal recess holes 202 is about 40 degrees to about 55 degrees. Certainly, the recess holes 202 of this invention are not limited to the quadrangular pyramidal recess holes. In other embodiments of the invention, the recess holes 202 can be other polygonal pyramidal recess holes, such as triangular pyramidal recess holes as shown in FIG. 3A, hexagonal pyramidal recess holes as shown in FIG. 3B, or cone recess holes as shown in FIG. 3C.

In addition, the pyramidal recess holes 202 of the recess array can be completely the same or not exactly the same. For instance, the included angles of the pyramidal recess holes 202 in the recess array can be not completely the same or completely the same. Besides, in the recess array, dimensions of the recess holes 202 are not completely the same or completely the same.

In view of the above, the light extraction enhanced film 200 is disposed on the light emitting surface 100a of the organic light emitting panel 100 according to this embodiment. Therefore, the light emitted from the organic light emitting layer 104 of the organic light emitting panel 100 can be transmitted through the covering plate 120 and the light extraction enhanced film 200 and then emitted to the air. Since the light extraction enhanced film 200 has the recess array 202, light emitted from the organic light emitting layer 104 can be emitted to the air to the greater extent, and thereby light extraction efficiency of the organic light emitting panel can be enhanced.

In the embodiment depicted in FIG. 1A, the upper surface 100b of the organic light emitting panel 100 is the light emitting surface, i.e., the organic light emitting panel 100 is the top-emissive organic light emitting panel. However, the light extraction enhanced film of this invention can also be applied to a bottom-emissive organic light emitting panel or a double-sided emissive organic light emitting panel, as provided hereinafter.

Figure 1B:
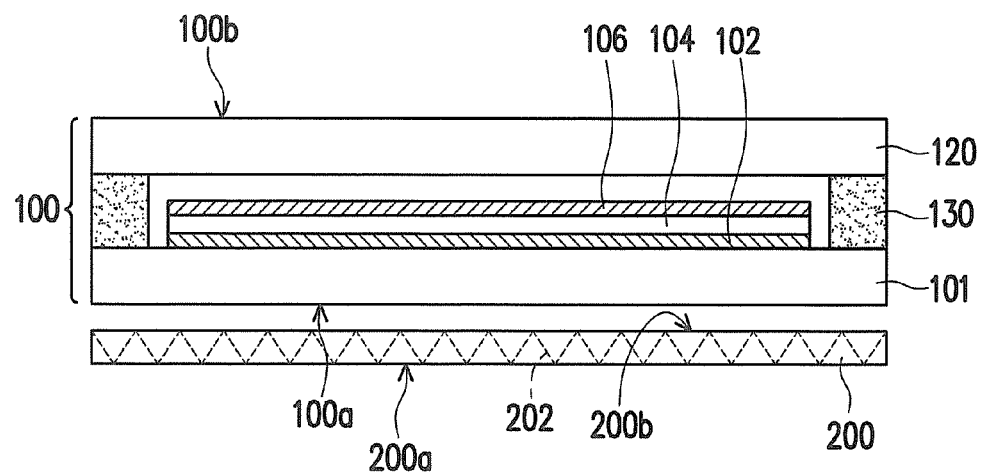
FIG. 1B is a schematic cross-sectional view illustrating an organic light emitting device according to an embodiment of the invention.

FIG. 1B is a schematic cross-sectional view illustrating an organic light emitting device according to an embodiment of the invention. The embodiment shown in FIG. 1B is similar to the embodiment shown in FIG. 1A, and therefore identical components in FIG. 1A and FIG. 1B are represented by the same numerals and not repeated herein. As indicated in FIG. 1B, the organic light emitting panel 100 of this embodiment is the bottom-emissive organic light emitting panel. The first electrode layer 102 of the organic light emitting panel 100 and the substrate 101 are made of the light-transmissive material, such that the light generated by the organic light emitting layer 106 can be emitted. Namely, the lower surface 100a of the organic light emitting panel 100 is the light emitting surface. The light extraction enhanced film 200 is disposed on the light emitting surface 100a of the organic light emitting panel 100. Specifically, the light extraction enhanced film 200 has a recess array that includes a plurality of recess holes 202, and the recess holes 202 are recessed toward the organic light emitting panel 100.

Figure 1C:
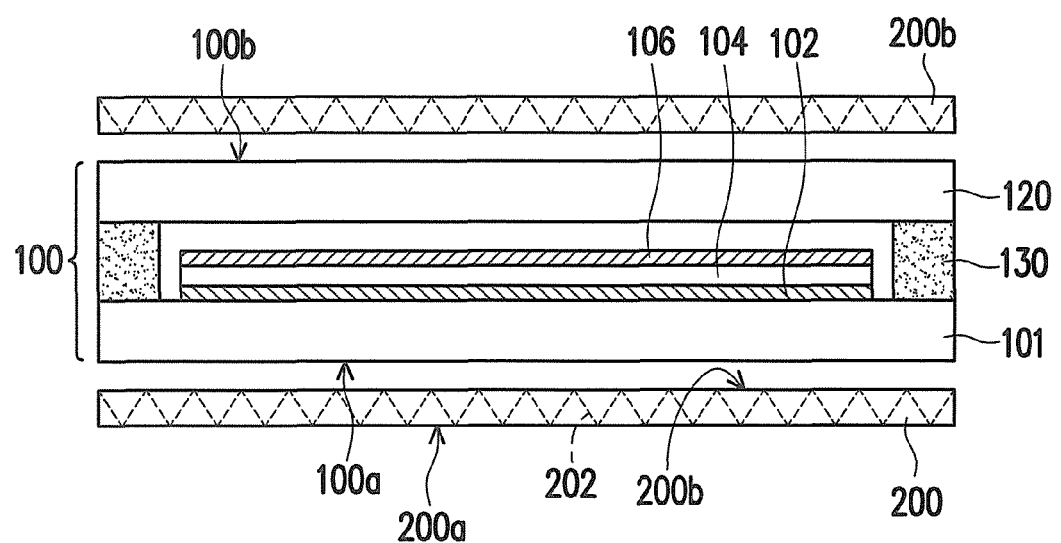
FIG. 1C is a schematic cross-sectional view illustrating an organic light emitting device according to an embodiment of the invention.

FIG. 1C is a schematic cross-sectional view illustrating an organic light emitting device according to an embodiment of the invention. The embodiment shown in FIG. 1C is similar to the embodiment shown in FIG. 1A, so that identical components in FIG. 1A and FIG. 1C are represented by the same numerals and not repeated herein. As indicated in FIG. 1C, the organic light emitting panel 100 of this embodiment is the double-sided emissive organic light emitting panel. In other words, the first electrode layer 102, the second electrode layer 106, the substrate 101, and the covering plate 120 in the organic light emitting panel 100 are made of light-transmissive materials, such that the light generated by the organic light emitting layer 106 can be emitted from both sides. Namely, the upper surface 100b and the lower surface 100a of the organic light emitting panel 100 are both the light emitting surfaces. Hence, the light extraction enhanced films 200a and 200b are respectively disposed on the light emitting surfaces 100a and 100b of the organic light emitting panel 100. Specifically, the light extraction enhanced films 200a and 200b respectively have a recess array (the recess holes 202), and the recess holes 202 are recessed toward the organic light emitting panel 100.

In the embodiments depicted in FIG. 1A to FIG. 1C, the light extraction enhanced film having the recess array is disposed on the light emitting surface of the organic light emitting panel, so as to increase the light extraction efficiency of the organic light emitting device. However, in other embodiments of the invention, the recess array can also be disposed on the substrate, on the covering plate, or both, as described below, so as to increase the light extraction efficiency of the organic light emitting device.

Figure 4:
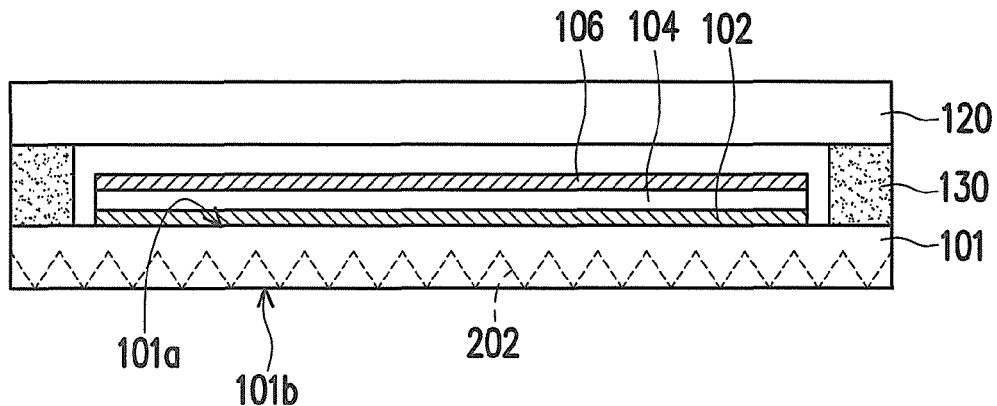
FIG. 4 is a schematic cross-sectional view illustrating an organic light emitting device according to an embodiment of the invention.

FIG. 4 is a schematic cross-sectional view illustrating an organic light emitting device according to an embodiment of the invention. The embodiment shown in FIG. 4 is similar to the embodiment shown in FIG. 1A, so that identical components in FIG. 1A and FIG. 4 are represented by the same numerals and not repeated herein. As indicated in FIG. 4, the organic light emitting device of this embodiment is the bottom-emissive organic light emitting device. In other words, the first electrode layer 102 and the substrate 101 of the organic light emitting device are made of light-transmissive materials, such that the light generated by the organic light emitting layer 106 can be emitted. Besides, the substrate 101 has the recess array (the recess holes 202), and the recess holes 202 are recessed toward the organic light emitting layer 106 from the substrate 101. Specifically, the substrate 101 has an upper surface 101a and a lower surface 101b opposite to the upper surface 101a. The first electrode layer 106 is located on the upper surface 101a of the substrate 101, and the recess array (the recess holes 202) is located on the lower surface 101b of the substrate 101. The upper surface 101a of the substrate 101 is a plane. Since the first electrode layer 106 is disposed on the upper surface 101a of the substrate 101, the planar upper surface 101a of the substrate 101 does not pose an impact on deposition or coating properties of the first electrode layer 106. In this embodiment, conditions of the recess array (the recess holes 202) in the substrate 101, i.e., the shape, the included angle, and distribution, are similar to those described in the previous embodiment depicted in FIG. 1A.

Figure 5:
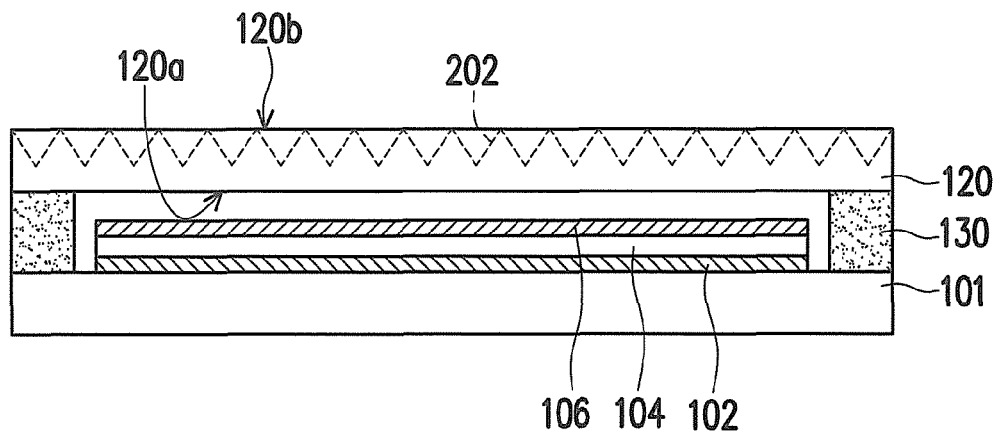
FIG. 5 is a schematic cross-sectional view illustrating an organic light emitting device according to an embodiment of the invention.

FIG. 5 is a schematic cross-sectional view illustrating an organic light emitting device according to an embodiment of the invention. The embodiment shown in FIG. 5 is similar to the embodiment shown in FIG. 1A, so that identical components in FIG. 1A and FIG. 5 are represented by the same numerals and not repeated herein. As indicated in FIG. 5, the organic light emitting device of this embodiment is the top-emissive organic light emitting device. In other words, the second electrode layer 106 and the covering plate 120 of the organic light emitting device are made of light-transmissive materials, such that the light generated by the organic light emitting layer 106 can be emitted. Besides, the covering plate 120 has the recess array (the recess holes 202), and the recess holes 202 are recessed toward the organic light emitting layer 104 from the covering plate 120. Specifically, the covering plate 120 has an inner surface 120a and an outer surface 120b opposite to the inner surface 120a. The inner surface 120a of the covering plate 120 faces the second electrode layer 106, and the recess array (the recess holes 202) is located on the outer surface 120b of the covering plate 120. The inner surface 120a of the covering plate 120 is preferably a plane. Similarly, in this embodiment, conditions of the recess array (the recess holes 202) in the covering plate 120, i.e., the shape, the included angle, and distribution, are similar to those described in the previous embodiment depicted in FIG. 1A.

Figure 6:
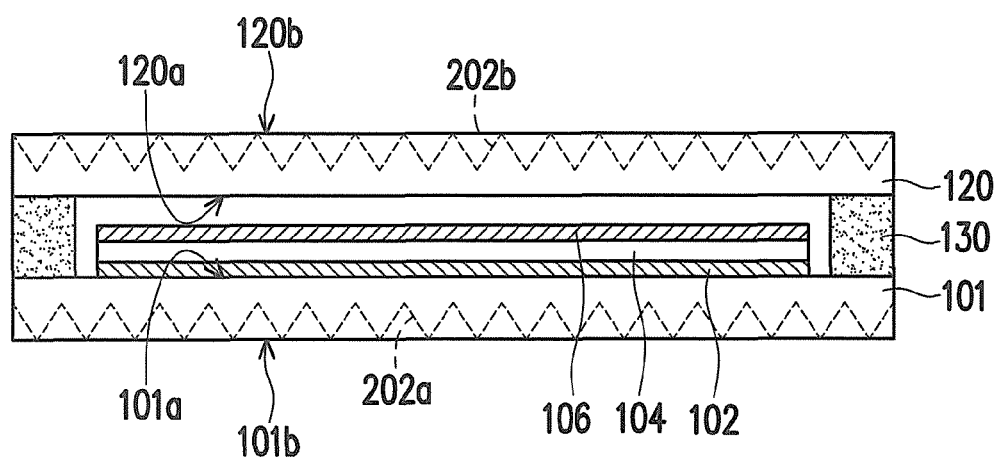
FIG. 6 is a schematic cross-sectional view illustrating an organic light emitting device according to an embodiment of the invention.

FIG. 6 is a schematic cross-sectional view illustrating an organic light emitting device according to an embodiment of the invention. The embodiment shown in FIG. 6 is similar to the embodiment shown in FIG. 1A, so that identical components in FIG. 1A and FIG. 6 are represented by the same numerals and not repeated herein. As indicated in FIG. 6, the organic light emitting device of this embodiment is the double-sided emissive organic light emitting device. In other words, the first electrode layer 102, the second electrode layer 106, the substrate 101, and the covering plate 120 of the organic light emitting panel 100 are made of light-transmissive materials, such that the light generated by the organic light emitting layer 106 can be emitted from both sides.

The substrate 101 has the recess array (the recess holes 202a), and the recess holes 202a are recessed toward the organic light emitting layer 104 from the substrate 101. Specifically, the substrate 101 has an upper surface 101a and a lower surface 101b opposite to the upper surface 101a. The first electrode layer 106 is located on the upper surface 101a of the substrate 101, and the recess array (the recess holes 202a) is located on the lower surface 101b of the substrate 101. The upper surface 101a of the substrate 101 is a plane. Since the first electrode layer 106 is disposed on the upper surface 101a of the substrate 101, the planar upper surface 101a of the substrate 101 does not pose an impact on deposition or coating properties of the first electrode layer 106. In this embodiment, conditions of the recess array (the recess holes 202a) in the substrate 101, i.e., the shape, the included angle, and distribution, are similar to those described in the previous embodiment depicted in FIG. 1A.

Besides, the covering plate 120 has the recess array (the recess holes 202b), and the recess holes 202b are recessed toward the organic light emitting layer 104 from the covering plate 120. Specifically, the covering plate 120 has an inner surface 120a and an outer surface 120b opposite to the inner surface 120a. The inner surface 120a of the covering plate 120 faces the second electrode layer 106, and the recess array (the recess holes 202b) is located on the outer surface 120b of the covering plate 120. The inner surface 120a of the covering plate 120 is preferably a plane. Similarly, in this embodiment, conditions of the recess array (the recess holes 202b) in the covering plate 120, i.e., the shape, the included angle, and distribution, are similar to those described in the previous embodiment depicted in FIG. 1A.

In light of the foregoing, the light extraction enhanced film having the recess array is disposed on the organic light emitting panel according to the invention. Alternatively, the recess array is disposed on the substrate, on the covering plate, or on both the substrate and the covering plate in the invention. Since the light emitted from the organic light emitting layer in the organic light emitting panel is transmitted through the recess array of the light extraction enhanced film, the recess array of the substrate, or the recess array of the covering plate and then emitted to the air, the light emitted from the organic light emitting layer can be emitted to the air to the greater extent, and thereby light extraction efficiency of the organic light emitting device can be enhanced.

It will be apparent to those skilled in the art that various modifications and variations can be made to the disclosure without departing from the scope or spirit of the invention. In view of the foregoing, it is intended that the invention cover modifications and variations of this invention provided they fall within the scope of the following claims and their equivalents.

What is claimed is:

1. An organic light emitting device comprising:
   an organic light emitting panel having at least one light emitting surface; and
   at least one light extraction enhanced film disposed on the at least one light emitting surface of the organic light emitting panel, wherein the at least one light extraction enhanced film has a recess array, the recess array includes a plurality of recess holes, wherein the recess holes are not communicating with each other, and the recess holes are recessed toward the organic light emitting panel.

2. The organic light emitting device as claimed in claim 1, wherein the recess holes are pyramidal recess holes or cone recess holes.

3. The organic light emitting device as claimed in claim 2, wherein an included angle between two legs of each of the pyramidal recess holes is about 40 degrees to about 55 degrees.

4. The organic light emitting device as claimed in claim 1, wherein the at least one light extraction enhanced film has a first surface and a second surface opposite to the first surface, the recess array is located on the first surface, and the second surface is a plane.

5. An organic light emitting device comprising:
   a substrate;
   a first electrode layer located on the substrate;
   an organic light emitting layer located on the first electrode layer; and
   a second electrode layer located on the organic light emitting layer,
   wherein the substrate has a first recess array, the first recess array includes a plurality of first recess holes, wherein the recess holes are not communicating with each other, and the first recess holes are recessed toward the organic light emitting layer from the substrate.

6. The organic light emitting device as claimed in claim 5, wherein the first recess holes are pyramidal recess holes or cone recess holes.

7. The organic light emitting device as claimed in claim 6, wherein an included angle between two legs of each of the pyramidal recess holes is about 40 degrees to about 55 degrees.

8. The organic light emitting device as claimed in claim 5, wherein the substrate has an upper surface and a lower surface opposite to the upper surface, the first electrode layer is located on the upper surface, the first recess array is located on the lower surface, and the upper surface is a plane.

9. The organic light emitting device as claimed in claim 5, further comprising a covering plate located on the second electrode layer, the covering plate having a second recess array, the second recess array including a plurality of second recess holes, the second recess holes being recessed toward the organic light emitting layer from the covering plate.

10. The organic light emitting device as claimed in claim 9, wherein the covering plate has an inner surface and an outer surface opposite to the inner surface, the inner surface faces the second electrode layer, the second recess array is located on the outer surface, and the inner surface is a plane.

11. An organic light emitting device comprising:
    a substrate;
    a first electrode layer located on the substrate;
    an organic light emitting layer located on the first electrode layer;
    a second electrode layer located on the organic light emitting layer; and
    a covering plate located on the second electrode layer, the covering plate having a recess array, the recess array including a plurality of recess holes, the recess holes being recessed toward the organic light emitting layer from the covering plate.

12. The organic light emitting device as claimed in claim 11, wherein the recess holes are pyramidal recess holes or cone recess holes.

13. The organic light emitting device as claimed in claim 12, wherein an included angle between two legs of each of the pyramidal recess holes is about 40 degrees to about 55 degrees.

14. The organic light emitting device as claimed in claim 11, wherein the covering plate has an inner surface and an outer surface opposite to the inner surface, the inner surface faces the second electrode layer, the recess array is located on the outer surface, and the inner surface is a plane.

* * * * *